United States Patent
Kim et al.

(10) Patent No.: US 10,178,785 B2
(45) Date of Patent: Jan. 8, 2019

(54) SPARK PREVENTING ELEMENT FOR PRINTED CIRCUIT BOARD

(71) Applicant: Samsung Display Co., LTD., Yongin, Gyeonggi-Do (KR)

(72) Inventors: Ki-Hyuk Kim, Yongin-si (KR); Nam-Hee Goo, Suwon-si (KR); Jin-Won Lee, Yongin-si (KR); Seuk-Whan Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 695 days.

(21) Appl. No.: 14/604,430

(22) Filed: Jan. 23, 2015

(65) Prior Publication Data
US 2016/0007496 A1   Jan. 7, 2016

(30) Foreign Application Priority Data

Jul. 4, 2014   (KR) .................. 10-2014-0083977

(51) Int. Cl.
| | |
|---|---|
| *H05K 7/02* | (2006.01) |
| *H05K 1/02* | (2006.01) |
| *H05K 1/11* | (2006.01) |
| *H01T 4/02* | (2006.01) |

(52) U.S. Cl.
CPC .............. *H05K 7/02* (2013.01); *H05K 1/026* (2013.01); *H01T 4/02* (2013.01); *H05K 1/116* (2013.01)

(58) Field of Classification Search
CPC .......... H05K 1/026; H05K 1/116; H05K 7/02; H01T 4/02

USPC ............................................................. 361/2
See application file for complete search history.

(56) References Cited

U.S. PATENT DOCUMENTS

| | | | |
|---|---|---|---|
| 6,241,537 B1 | 6/2001 | Tate et al. | |
| 6,285,535 B1* | 9/2001 | Nakamura | H01T 4/12 361/111 |
| 6,493,198 B1 | 12/2002 | Arledge et al. | |
| 9,112,310 B2* | 8/2015 | Shahohian | H01R 13/6658 |
| 2009/0200063 A1 | 8/2009 | Omerovic | |
| 2011/0149452 A1* | 6/2011 | Whitefield | H01T 4/08 361/56 |
| 2012/0106018 A1* | 5/2012 | Shahohian | H01R 13/6658 361/119 |

(Continued)

FOREIGN PATENT DOCUMENTS

| | | |
|---|---|---|
| JP | 2002270331 A | 9/2002 |
| JP | 2007520074 A | 7/2007 |
| WO | 2005074027 A3 | 8/2005 |

*Primary Examiner* — Kevin J Comber
(74) *Attorney, Agent, or Firm* — H.C. Park & Associates, PLC

(57) ABSTRACT

A spark-preventing element embedded in a printed circuit board includes a capacitive output electrode, a capacitive input electrode, an interlayer conductive member electrically connecting the capacitive output electrode to a signal line, and an interlayer insulation member electrically insulating the capacitive input electrode from the signal line, The capacitive input electrode is spaced apart from the capacitive output electrode with an air gap disposed between the capacitive output electrode and the capacitive input electrode, surrounds the capacitive output electrode, and is electrically connected to the ground layer. The spark-preventing element has an improved electrical characteristic and an increased durability.

20 Claims, 9 Drawing Sheets

(56) References Cited

U.S. PATENT DOCUMENTS

2014/0177114 A1\* 6/2014 Otsubo ................... H01T 1/22
361/56

\* cited by examiner and surrounds the capacitive output electrode, and is electrically connected to the ground layer.

According to another exemplary embodiment, a spark-prevented substrate includes a printed circuit board and a spark-preventing element embedded in the printed circuit board. The printed circuit board includes an insulation substrate, a solder resistor disposed on the insulation substrate, a ground layer disposed on the insulation substrate, and a signal line. The spark-preventing element includes a capacitive output electrode, a capacitive input electrode, an interlayer conductive member electrically connecting the capacitive output electrode to the signal line, an interlayer insulation member electrically insulating the capacitive input electrode from the signal line. The capacitive input electrode is spaced apart from the capacitive output electrode with an air gap disposed between the capacitive output electrode and the capacitive input electrode, and surrounds the capacitive output electrode, and is electrically connected to the ground layer.

SPARK PREVENTING ELEMENT FOR PRINTED CIRCUIT BOARD

PRIORITY STATEMENT

This application claims priority under 35 U.S.C. § 119 to Korean Patent Application No. 10-2014-0083977, filed on Jul. 4, 2014, and all the benefits accruing therefrom, the content of which is herein incorporated by reference in its entirety.

BACKGROUND

Field of Invention

Exemplary embodiments relate to a spark-preventing element for a printed circuit board. More particularly, exemplary embodiments relate to a spark-preventing element, which has improved electrical characteristics and durability, for a printed circuit board.

Description of the Related Art

An electrical circuit device includes a plurality of electrical elements disposed in a substrate. As a function of the electrical circuit device is improved, a degree of integration for the electrical elements is increased.

As a degree of integration for the electrical elements is increased, size of each of the electrical elements and allowable power are reduced. In a conventional method, as degree of integration for the electrical elements is increased, the electrical elements are designed as a pattern, and are printed on a circuit board.

The electrical elements may be damaged due to dielectric breakdown or the like, when power greater than allowable power is provided. The dielectric breakdown may cause ignition.

In order to prevent electrical elements from receiving power greater than allowable power, various electrical elements such as a transient voltage suppressor (TVS) diode, a spark gap or the like has been developed.

However, the TVS diode is expensive, and has a limited power rating. Furthermore, static current voltage (SI) characteristics may be reduced by parasitic capacitance.

Furthermore, since the spark gap has capacitance characteristics that may be changed as the number of evaluations are increased, reliability is low. Furthermore, the spark gap has high breakdown voltage.

SUMMARY

Exemplary embodiments provide a spark-preventing element, which has an improved electrical characteristic and an increased durability, for a printed circuit board, and a spark-prevented substrate that includes the spark-preventing element.

According to an exemplary embodiment, a spark-preventing element is embedded in a printed circuit board including an insulation substrate, a solder resistor disposed on the insulation substrate, a ground layer disposed on the insulation substrate, and a signal line. The spark-preventing element includes a capacitive output electrode, a capacitive input electrode, an interlayer conductive member electrically connecting the capacitive output electrode to the signal line, an interlayer insulation member electrically insulating the capacitive input electrode from the signal line. The capacitive input electrode is spaced apart from the capacitive output electrode with an air gap disposed between the capacitive output electrode and the capacitive input elec- In an exemplary embodiment, the air gap is not covered by any element of the printed circuit board.

In an exemplary embodiment, the ground layer includes an upper ground layer disposed on an upper surface of the insulation substrate, a lower ground layer disposed on a lower surface of the insulation substrate, and a ground connector electrically connecting the upper ground layer to the lower ground layer. the capacitive input electrode directly connected to the upper ground layer In an exemplary embodiment, the capacitive output electrode is disposed at the same layer as the upper ground layer.

In an exemplary embodiment, the capacitive input electrode is disposed at the same layer as the capacitive output electrode.

In an exemplary embodiment, the capacitive output electrode is disposed in a layer different from the signal line.

In an exemplary embodiment, the spark-preventing element further includes a capacitive input terminal connected to the capacitive input electrode and protruding toward the capacitive output electrode.

In an exemplary embodiment, the capacitive input terminal includes a round surface.

In an exemplary embodiment, the capacitive input terminal includes a sharp corner.

In an exemplary embodiment, the capacitive input terminal includes a flat rectangular surface.

In an exemplary embodiment, the spark-preventing element further includes a plurality of the capacitive input terminals connected to the capacitive input electrode and protruding toward the capacitive output electrode.

In an exemplary embodiment, the spark-preventing element further includes a capacitive output terminal connected to the capacitive output electrode and protruding toward the capacitive input terminal.

In an exemplary embodiment, the capacitive output terminal includes a flat rectangular surface facing the capacitive input terminal.

In an exemplary embodiment, the spark-preventing element further includes a plurality of capacitive output terminals connected to the capacitive output electrode and protruding toward the capacitive input terminal.

In an exemplary embodiment, the insulation substrate includes an upper insulation layer and a lower insulation layer disposed under the upper insulation layer.

In an exemplary embodiment, the signal line is disposed between the upper insulation layer and the lower insulation layer.

In an exemplary embodiment, the lower ground layer is disposed between the upper insulation layer and the lower insulation layer, and the ground connector passes through the upper insulation layer.

In an exemplary embodiment, the spark-preventing element includes a plurality of capacitive output electrodes.

In an exemplary embodiment, the capacitive input electrode is spaced apart from each of the capacitive output electrodes with an air gap disposed between the capacitive input electrode and the each of the capacitive output electrode, the capacitive input electrode enclosing each of the capacitive output electrodes.

In an exemplary embodiment, the printed circuit board includes a plurality of signal lines, each of the capacitive output electrode being electrically connected to one of the signal lines.

According to the exemplary embodiments, the solder resistor is patterned to be removed between the capacitive output electrode and the capacitive input electrode. Thus, even if the number of operations of the spark-preventing element is increased, a breakdown voltage may be stably maintained.

Furthermore, since the capacitive input electrode surrounds the capacitive output electrode, leakage of a static electricity may be prevented.

Furthermore, since the signal line is electrically insulated from the capacitive input terminal and the capacitive input electrode, a parasitic capacitor between the signal line and the capacitive input electrode or between the signal line and the capacitive input terminal may be prevented.

Furthermore, the capacitive input electrode is electrically connected to the lower ground layer as well as the upper ground layer, a static electricity applied to the signal line may be effectively grounded.

Furthermore, since the spark-preventing element is disposed in a layer different from the signal line, a circuit may be designed with various configurations.

Furthermore, when the insulation substrate includes a plurality of insulation layers, a spark may be prevented even if a circuit structure is complicated.

Furthermore, when the capacitive input electrode includes a plurality of capacitive input terminals, a breakdown voltage may be uniformly maintained. Furthermore, when the capacitive input terminals have a round shape protruding toward the capacitive output electrode, a static electricity may be prevented from being focused on a specific point.

Furthermore, when the capacitive input terminals have a flat surface facing the capacitive output electrode, a current may be prevented from rapidly flowing.

Furthermore, when the capacitive input terminals and the capacitive output terminals have a flat surface to face each other with a uniform gap, a static electricity may be prevented from being focused on a specific point.

Furthermore, when the spark-preventing element is connected to a plurality of signal lines, a spark may be effectively prevented.

Accordingly, an electrical characteristic, a reliability and a durability of the spark-preventing element may be improved, and a breakdown voltage may be easily adjusted.

BRIEF DESCRIPTION OF THE DRAWINGS

The above and other features and advantages will become more apparent by describing exemplary embodiments thereof with reference to the accompanying drawings, in which.

DETAILED DESCRIPTION

Exemplary embodiments will be described more fully hereinafter with reference to the accompanying drawings, in which various embodiments are shown.

Figure 1:
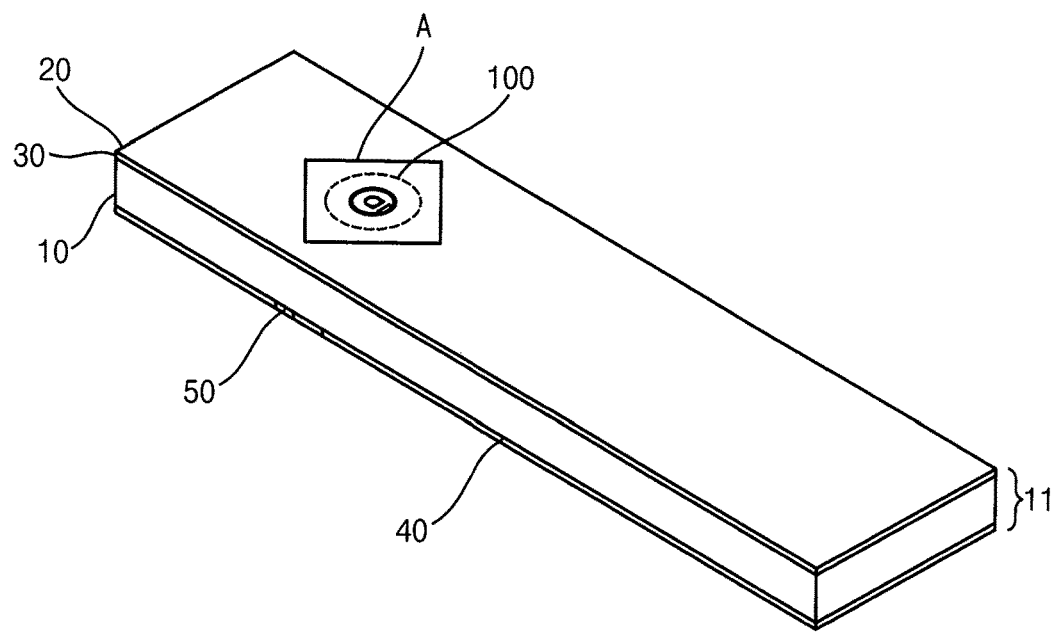
FIG. 1 is a perspective view illustrating a spark-preventing element according to an exemplary embodiment.

FIG. 1 is a perspective view illustrating a spark-preventing element according to an exemplary embodiment.

Referring to FIG. 1, a spark-preventing element 100 is disposed in a substrate 11 including an insulation substrate 10, a solder resistor 20, an upper ground layer 30, a lower ground layer 40, a ground connector 35 (shown in FIG. 4) and a signal line 50. The substrate 11 may include a printed circuit board.

The insulation substrate 10 may include a flat substrate including an insulation material.

The solder resistor 20 is disposed on an upper surface of the insulation substrate 10, and covers the upper ground layer 30. In an exemplary embodiment, the solder resistor 20 includes a material having a high permittivity. For example, the solder resistor 20 may include a synthetic resin.

The upper ground layer 30 is disposed on an upper surface of the insulation substrate 10, and is electrically grounded. In an exemplary embodiment, the upper ground layer 30 is disposed substantially on an entire portion of the upper surface of the insulation substrate 10. For example, the upper ground layer 30 may cover at least 90% of the upper surface of the insulation substrate 10. In another embodiment, the upper ground layer 30 may be disposed on only a portion of the upper surface of the insulation substrate 10.

The upper ground layer 30 includes a conductive material such as a metal.

The lower ground layer 40 is disposed on a lower surface of the insulation substrate 10, and is electrically grounded. In an exemplary embodiment, the lower ground layer 40 may cover at least a half of the lower surface of the insulation substrate 10.

The lower ground layer 40 includes a conductive material such as a metal. In an exemplary embodiment, the lower ground layer 40 may include the same material as the upper ground layer 30.

The ground connector 35 passes through the insulation substrate 10 to electrically connect the upper ground layer 30 and the lower ground layer 40 to each other.

The ground connector 35 includes a conductive material such as a metal. In an exemplary embodiment, the ground connector 35 may include the same material as the upper ground layer 30 and the lower ground layer 40.

The signal line 50 is disposed at the same layer as the lower ground layer 40, and is disposed on the lower surface of the insulation substrate 10. In an exemplary embodiment, the signal line 50 is spaced apart from the lower ground layer 40.

In an exemplary embodiment, the signal line 50 may include the same material as the lower ground layer 40.

For example, a lower solder resistor (not shown) may be formed on the lower surface of the insulation substrate 10 to cover the signal line 50 and the lower ground layer 40.

Figure 2:
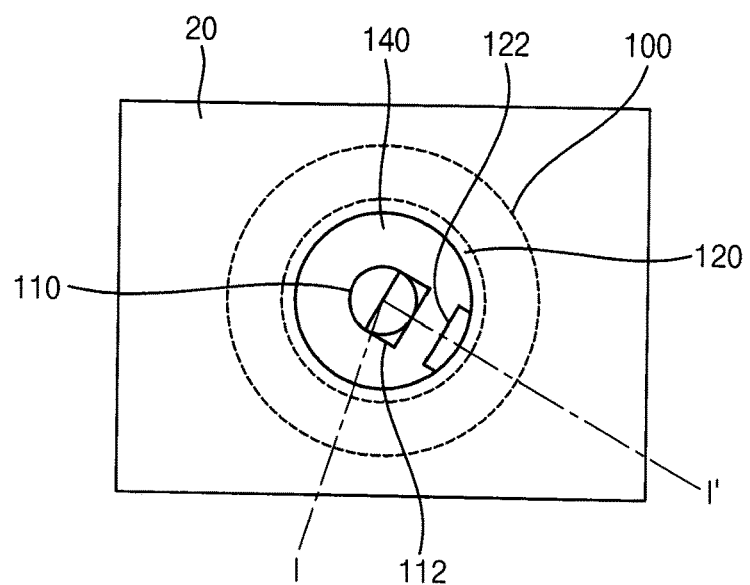
FIG. 2 is an enlarged perspective view illustrating the region A of FIG. 1.
Figure 3:
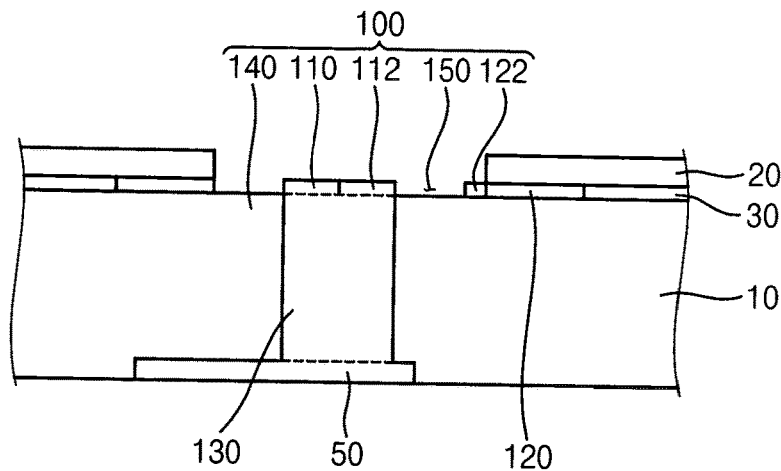
FIG. 3 is a cross-sectional view taken along the line I-I' of FIG. 2.
Figure 4:
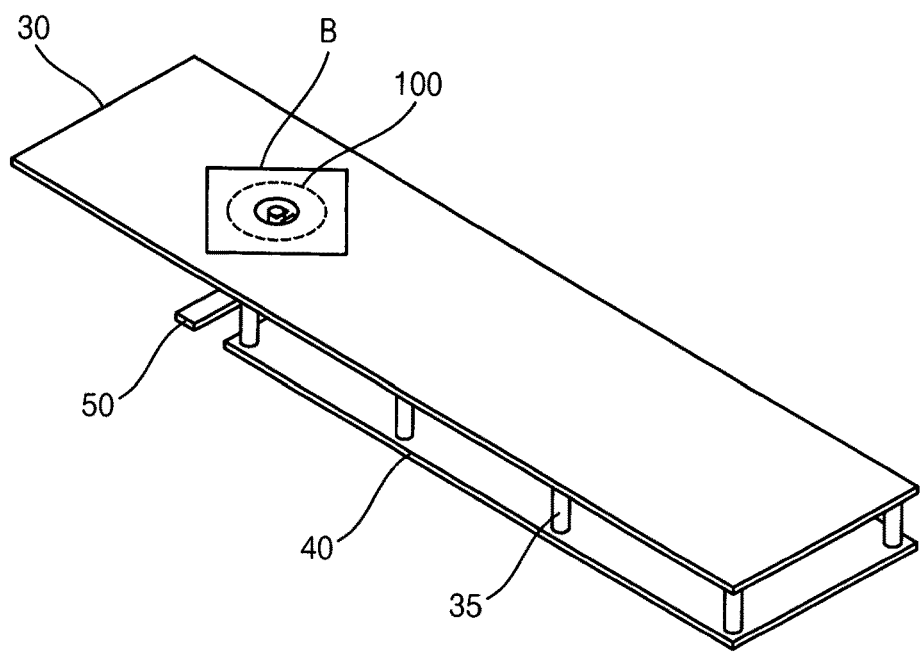
FIG. 4 is a perspective view illustrating conductive members of FIG. 1.
Figure 5:
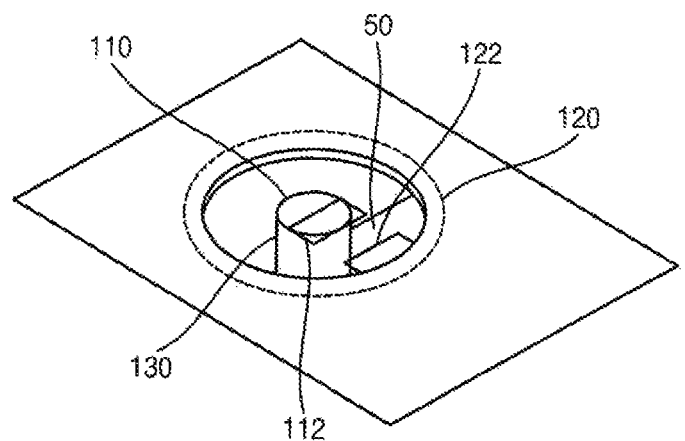
FIG. 5 is an enlarged perspective view illustrating the region B of FIG. 1.

FIG. 2 is an enlarged perspective view illustrating the region A of FIG. 1. FIG. 3 is a cross-sectional view taken along the line I-I' of FIG. 2. FIG. 4 is a perspective view illustrating conductive members of FIG. 1. FIG. 5 is an enlarged perspective view illustrating the region B of FIG. 4.

Referring to FIGS. 1 to 5, a spark-preventing element for a printed circuit board includes a capacitive output electrode 110, a capacitive input electrode 120, an interlayer conductive member 130, an interlayer insulation member 140 and an air gap 150.

The capacitive output electrode 110 is disposed at the same layer as the upper ground layer 30, and is disposed on an upper surface of the interlayer conductive member 130. In an exemplary embodiment, the capacitive output electrode 110 has a circular shape in a plan view, and includes the same material as the upper ground layer 30.

A capacitive output terminal 112 protrudes from an end of the capacitive output electrode 110. The capacitive output terminal 112 is disposed at the same layer as the upper ground layer 30. A portion of the capacitive output terminal 112 is disposed on an upper surface of the interlayer insulation member 140, and another portion of the capacitive output terminal 112 is disposed on the interlayer conductive member 130. As shown in FIGS. 1 and 3, for example, a corner portion of the capacitive output terminal 112 is disposed on an upper surface of the interlayer insulation member 140, while the rest portion of the capacitive output terminal 112 is disposed on the interlayer conductive member 130. In another embodiment, the capacitive output terminal 112 may be disposed on the upper surface of the interlayer conductive member 130.

The capacitive input electrode 120 is disposed at the same layer as the upper ground layer 30, and is disposed on the upper surface of the interlayer insulation member 140. The capacitive input electrode 120 is electrically connected to the upper ground layer 30. In an exemplary embodiment, the capacitive input electrode 120 is surrounded by the upper ground layer 30.

The capacitive input electrode 120 is spaced apart from the capacitive output electrode 110 to surround the capacitive output electrode 110, as shown in FIG. 1.

The air gap 150 is disposed between the capacitive output electrode 110 and the capacitive input electrode 120. If the solder resistor 20 is disposed between the capacitive output electrode 110 and the capacitive input electrode 120, the solder resistor 30 may be partially damaged when a spark is generated between the capacitive output electrode 110 and the capacitive input electrode 120. The damaged portion of the solder resistor 20 may reduce reliability of a static electricity preventing element. In an exemplary embodiment, the solder resistor 20 is patterned so that the solder resistor 20 does not exist between the capacitive output electrode 110 and the capacitive input electrode 120. The air gap 150 may be refreshed by a fresh air even if a spark is generated between the capacitive output electrode 110 and the capacitive input electrode 120. Thus, electrical characteristics of the air gap 150 may be maintained without deterioration. Thus, reliability of the static electricity preventing element may be improved.

In an exemplary embodiment, a capacitive input terminal 122 protrudes from an end of the capacitive input electrode 120 toward the capacitive output electrode 110. The capacitive input terminal 122 is disposed to face the capacitive output terminal 112. The capacitive input terminal 122 is disposed at the same layer as the upper ground layer 30, and is disposed on the upper surface of the interlayer insulation member 140.

A distance between the capacitive input terminal 122 and the capacitive output terminal 112 is smaller than a distance between the capacitive output electrode 110 and the capacitive input electrode 120. Thus, a breakdown voltage between the capacitive output electrode 110 and the capacitive input electrode 120 may be adjusted by adjusting a distance between the capacitive input terminal 122 and the capacitive output terminal 112. For example, when a distance between the capacitive input terminal 122 and the capacitive output terminal 112 is reduced, a breakdown voltage between the capacitive output electrode 110 and the capacitive input electrode 120 may be reduced. When a distance between the capacitive input terminal 122 and the capacitive output terminal 112 is increased, a breakdown voltage between the capacitive output electrode 110 and the capacitive input electrode 120 may be increased.

The interlayer conductive member 130 passes through the interlayer insulation member 140 to electrically connect the capacitive output electrode 110 to the signal line 50. In an exemplary embodiment, the interlayer conductive member 130 may include the same material as the upper ground layer 30. For example, an opening may be formed through the interlayer insulation member 140 to expose a portion of the signal line 50. Thereafter, a metal layer is deposited on the insulation substrate 10 to form the upper ground layer 30 and the interlayer conductive member 130 together.

The interlayer insulation member 140 is a portion of the insulation substrate 10, and surrounds the interlayer conductive member 130, and electrically insulates the signal line 50 from the capacitive input electrode 120 and the capacitive input terminal 122.

Hereinafter, operation of the spark-preventing element 100 for a printed circuit board will be explained in details.

A static electricity having a voltage greater a breakdown voltage is applied to the signal line 50.

Then, the static electricity is applied to the capacitive output electrode 110 through the interlayer conductive member 130.

The static electricity applied to the capacitive output electrode 110 is applied to the capacitive output terminal 112.

Breakdown is generated in the air gap 150 positioned between the capacitive output terminal 112 and the capacitive input terminal 122 so that a current can flow between the capacitive output terminal 112 and the capacitive input terminal 122.

A current is applied to the capacitive input terminal 122 through the air gap 150 by the breakdown. While the breakdown is generated, the signal line 50 is electrically insulated from the capacitive input terminal 122 and capacitive input electrode 120. Thus, a parasitic capacitance between the signal line 50 and the capacitive input terminal 122 or between the signal line 50 and the capacitive input electrode 120 may be prevented.

The current applied to the capacitive input terminal 122 is grounded to the lower ground layer 40 through the upper ground layer 30 and the ground connector 35.

According to the above, the solder resistor 20 is patterned to be removed in a space between the capacitive output electrode 110 and the capacitive input electrode 120. Thus, even if the number of operations of the spark-preventing element 100 is increased, a breakdown voltage may be stably maintained. In other words, the air gap 150 is not covered by the solder resistor or any member of the substrate 11.

Furthermore, since the capacitive input electrode 120 entirely surrounds the capacitive output electrode 110, a static electricity leaking into other elements may be prevented.

Furthermore, since the signal line 50 is electrically insulated from the capacitive input terminal 122 and the capacitive input electrode 120 by the interlayer insulation member 140, a parasitic capacitance between the signal line 50 and the capacitive input terminal 122 or between the signal line 50 and the capacitive input electrode 120 may be prevented.

Furthermore, since the capacitive input electrode 120 is electrically connected to the lower ground layer 40 as well as the upper ground layer 30, a static electricity applied to the signal line 50 may be effectively grounded.

Furthermore, since the spark-preventing element 100 is disposed in a different layer from the signal line 50, a circuit may be designed with various configurations.

Figure 6:
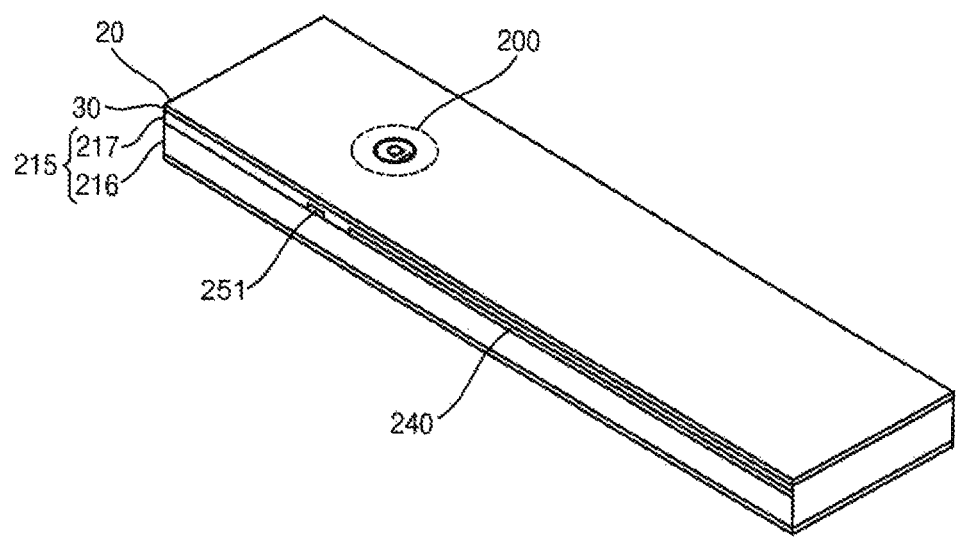
FIG. 6 is a perspective view illustrating a spark-preventing element according to an exemplary embodiment.

FIG. 6 is a perspective view illustrating a spark-preventing element according to an exemplary embodiment.

Referring to FIG. 6, a spark-preventing element 200 is disposed in a substrate including an insulation substrate 215, a solder resistor 20, an upper ground layer 30, an inner ground layer 240, a ground connector 235 (shown in FIG. 7) and a signal line 251. The substrate may include a printed circuit board.

The insulation substrate 215 includes a flat multiple-layered substrate. In an exemplary embodiment, the insulation substrate 215 includes a lower insulation layer 216 and an upper insulation layer 217. The lower insulation layer 216 and the upper insulation layer 217 may include the same material. A conductive pattern such as the signal line 251 or the inner ground layer 240 is disposed between the lower insulation layer 216 and the upper insulation layer 217. In another embodiment, the insulation substrate 215 may include at least three insulation layers.

The solder resistor 20 is disposed on an upper surface of the upper insulation layer 217 of the insulation substrate 215, and covers the upper ground layer 30. In an exemplary embodiment, the solder resistor 20 includes a material having a high permittivity. For example, the solder resistor 20 may include a synthetic resin.

The upper ground layer 30 is disposed on the upper surface of the upper insulation layer 217 of the insulation substrate 215, and is electrically grounded. In an exemplary embodiment, the upper ground layer 30 is disposed substantially on an entire portion of the upper surface of the upper insulation layer 217. For example, the upper ground layer 30 may cover at least 90% of the upper surface of the upper insulation layer 217. In another embodiment, the upper ground layer 30 may be disposed on only a portion of the upper surface of the upper insulation layer 217.

The upper ground layer 30 includes a conductive material such as a metal.

The inner ground layer 240 is disposed between the upper insulation layer 217 and the lower insulation layer 216, and is electrically grounded. In an exemplary embodiment, the inner ground layer 240 may cover at least a half of an interface between the upper insulation layer 217 and the lower insulation layer 216.

The inner ground layer 240 includes a conductive material such as a metal. In an exemplary embodiment, the inner ground layer 240 may include the same material as the upper ground layer 30.

The ground connector 235 passes through the upper insulation layer 217 to electrically connect the upper ground layer 30 to the inner ground layer 240.

The ground connector includes a conductive material such as a metal. In an exemplary embodiment, the ground connector may include the same material as the upper ground layer 30 and the inner ground layer 240.

The signal line 251 is disposed at the same layer as the inner ground layer 240, and is disposed on the interface between the upper insulation layer 217 and the lower insulation layer 216. In an exemplary embodiment, the signal line 251 is spaced apart from the inner ground layer 240.

In an exemplary embodiment, the signal line 251 may include the same material as the inner ground layer 240.

The signal line 251 and the inner ground layer 240 are covered by the lower insulation layer 216 to be electrically insulated from an exterior.

For example, a lower solder resistor (not shown) may be formed on the lower surface of the insulation substrate 215.

Figure 7:
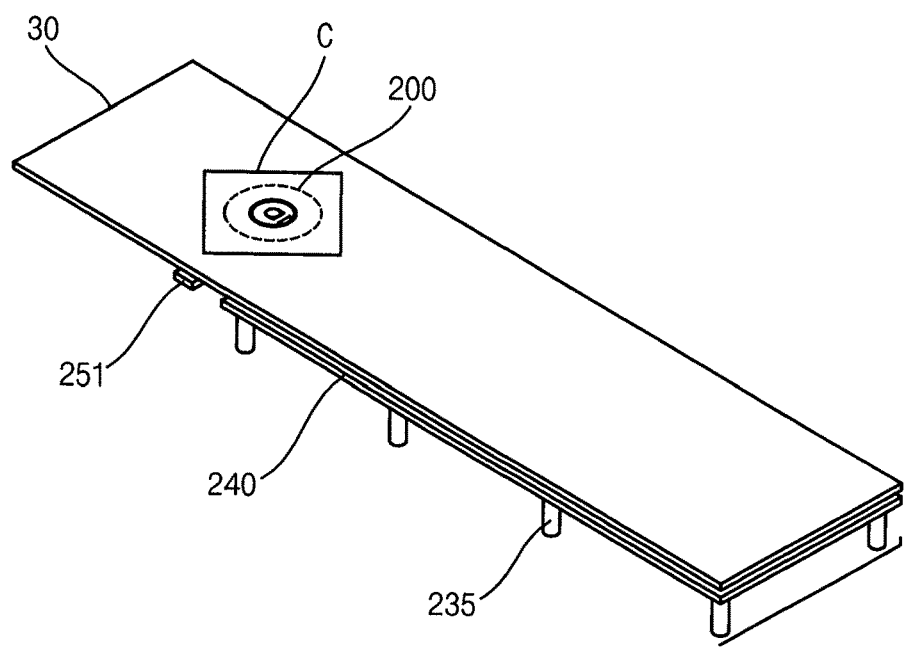
FIG. 7 is a perspective view illustrating the conductive members of FIG. 6.
Figure 8:
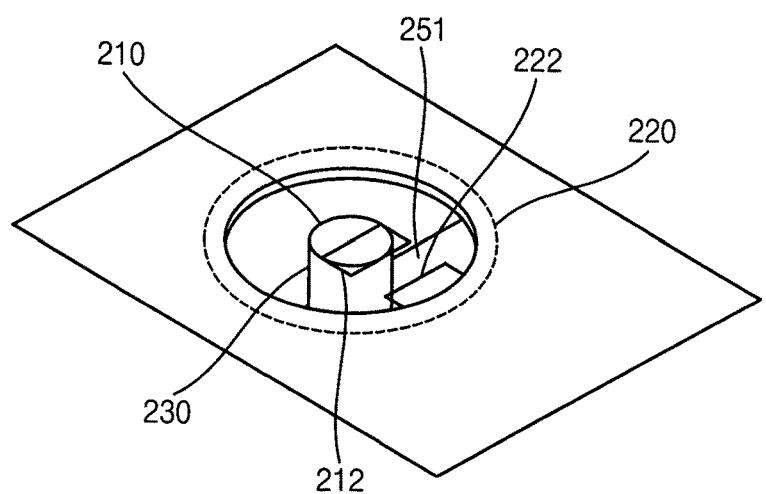
FIG. 8 is an enlarged perspective view illustrating the region C of FIG. 7.
Figure 9:
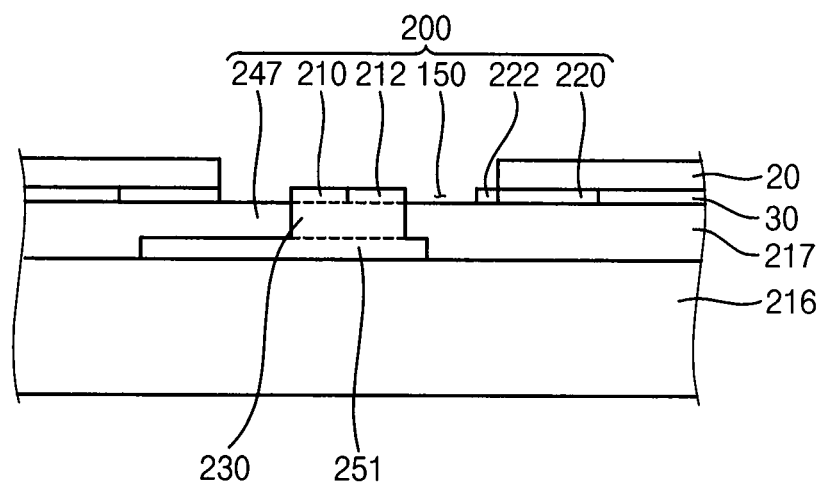
FIG. 9 is a cross-sectional view illustrating the spark-preventing element of FIG. 8.

FIG. 7 is a perspective view illustrating the conductive members of FIG. 6. FIG. 8 is an enlarged perspective view illustrating the region C of FIG. 7. FIG. 9 is a cross-sectional view illustrating the spark-preventing element of FIG. 6.

Referring to FIGS. 6 to 9, a spark-preventing element 200 for a printed circuit board (or a substrate) includes a capacitive output electrode 210, a capacitive input electrode 220, an interlayer conductive member 230, an interlayer insulation member 247 and an air gap 150.

The capacitive output electrode 210 is disposed at the same layer as the upper ground layer 30, and is disposed on an upper surface of the interlayer conductive member 230. In an exemplary embodiment, the capacitive output electrode 210 has a circular shape in a plan view, and includes the same material as the upper ground layer 30.

A capacitive output terminal 212 protrudes from an end of the capacitive output electrode 210. The capacitive output terminal 212 is disposed at the same layer as the upper ground layer 30, and is disposed on an upper surface of the interlayer insulation member 247. In another embodiment, the capacitive output terminal 212 may be disposed on the upper surface of the interlayer conductive member 230.

The capacitive input electrode 220 is disposed at the same layer as the upper ground layer 30 that is disposed on the upper surface of the interlayer insulation member 247. The capacitive input electrode 220 is electrically connected to the upper ground layer 30. In an exemplary embodiment, the capacitive input electrode 220 is surrounded by the upper ground layer 30.

The capacitive input electrode 220 is spaced apart from the capacitive output electrode 210 to surround the capacitive output electrode 210.

The air gap 150 is disposed between the capacitive output electrode 210 and the capacitive input electrode 220. In an exemplary embodiment, the solder resistor 20 is patterned so that the solder resistor 20 does not exist between the capacitive output electrode 210 and the capacitive input electrode 220. In other words, the air gap 150 is not covered by any layer. The air gap 150 may be refreshed by fresh air even if a spark is generated between the capacitive output electrode 210 and the capacitive input electrode 220. Thus, electrical characteristics of the air gap 150 may be maintained without deterioration. Thus, reliability of the static electricity preventing element (spark-preventing element) 200 may be improved.

In an exemplary embodiment, a capacitive input terminal 222 inwardly protrudes from an end of the capacitive input electrode 220 toward the captive output terminal 212. The capacitive input terminal 222 is disposed on the interlayer insulation member 247, and faces the capacitive output terminal 212. The capacitive input terminal 222 is disposed at the same layer as the upper ground layer 30, and electrically connected to the capacitive input electrode 220.

A distance between the capacitive input terminal 222 and the capacitive output terminal 212 is smaller than a distance between the capacitive output electrode 210 and the capacitive input electrode 220. Thus, a breakdown voltage between the capacitive output electrode 210 and the capacitive input electrode 220 may be adjusted by adjusting a distance between the capacitive input terminal 222 and the capacitive output terminal 212.

The interlayer conductive member 230 passes through the interlayer insulation member 247 to electrically connect the capacitive output electrode 210 to the signal line 251.

The interlayer insulation member 247 is a portion of the upper insulation layer 217, and surrounds the interlayer conductive member 230, and electrically insulates the signal line 251 from the capacitive input electrode 220 and the capacitive input terminal 222.

Hereinafter, operation of the spark-preventing element 200 for a printed circuit board will be explained in details.

A static electricity having a voltage greater a breakdown voltage is applied to the signal line 251.

Then, the static electricity having the voltage greater the breakdown voltage is applied to the capacitive output terminal 212 through the interlayer conductive member 230 and the capacitive output electrode 210.

Breakdown is generated in the air gap 150 between the capacitive output terminal 212 and the capacitive input terminal 222 so that a current can flow between the capacitive output terminal 212 and the capacitive input terminal 222.

A current is applied to the capacitive input terminal 222 through the air gap 150 with the breakdown. While the breakdown is generated, the signal line 251 is electrically insulated from the capacitive input terminal 222 and capacitive input electrode 220. Thus, a parasitic capacitance between the signal line 251 and the capacitive input terminal 222 or between the signal line 251 and the capacitive input electrode 220 may be prevented.

The current applied to the capacitive input terminal 222 is grounded to the lower ground layer 40 through the upper ground layer 30 and the ground connector 235.

According to an embodiment, since the insulation substrate 215 includes a plurality of insulation layers 216 and 217. Thus, even if a circuit in the substrate has complicated structures, a spark may be effectively prevented.

FIG. 10A to 10E are perspective views illustrating spark-preventing elements according to exemplary embodiments. Components of each of the spark-preventing elements are substantially same as the spark-preventing elements illustrated in FIGS. 1 to 5 except for a capacitive output electrode and a capacitive input electrode. Thus, any duplicative explanation may be omitted.

Figure 10A:
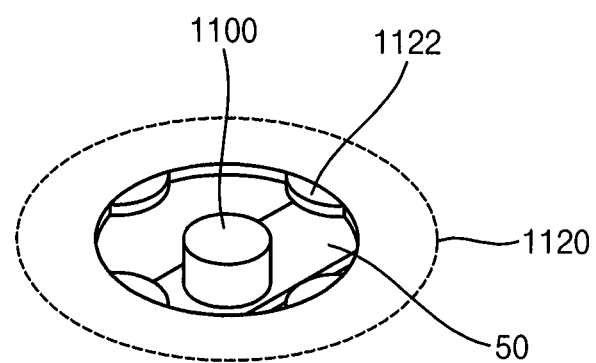
FIG. 10A to 10E are perspective views illustrating spark-preventing elements according to exemplary embodiments.

Referring to FIG. 10A, a capacitive output electrode does not include a capacitive output terminal, and a capacitive input electrode has a circular shape in a plan view.

Referring to FIGS. 3 and 10A, a spark-preventing element for a printed circuit board includes a capacitive output electrode 1100, a capacitive input electrode 1120, an interlayer conductive member 130, an interlayer insulation member 140 and an air gap 150.

The capacitive output electrode 1100 is disposed at the same layer as an upper ground layer 30, and is disposed on an upper surface of the interlayer conductive member 130. In an exemplary embodiment, the capacitive output electrode 1100 has a circular shape in a plan view, and includes the same material as the upper ground layer 30. In an exemplary embodiment, the capacitive output electrode 1100 does not include a capacitive output terminal like the capacitive output terminal 112 illustrated in FIG. 2.

The capacitive input electrode 1120 is disposed at the same layer as the upper ground layer 30, and is disposed on the upper surface of the interlayer insulation member 140. The capacitive input electrode 1120 is electrically connected to the upper ground layer 30.

The capacitive input electrode 1120 is spaced apart from the capacitive output electrode 1100 to surround the capacitive output electrode 1100.

The capacitive input electrode 1120 includes a plurality of capacitive input terminals 1122 that inwardly protrude from the capacitive input electrode 1120. In an exemplary embodiment, four capacitive input terminals 1122 are disposed evenly spaced apart from each other with a 90 degree interval to enclose the capacitive output electrode 1100 and to face the capacitive output electrode 1100. The capacitive input terminals 1122 are disposed at the same layer as the upper ground layer 30, and are disposed on the upper surface of the interlayer insulation member 140.

In an exemplary embodiment, a side of each of the capacitive input terminals 1122, which faces the capacitive output electrode 1100, has a round shape protruding toward the capacitive output electrode 1100.

A distance between the capacitive input terminal 1122 and the capacitive output electrode 1100 is smaller than a distance between the capacitive output electrode 1100 and the capacitive input electrode 1120. Thus, a breakdown voltage between the capacitive output electrode 1100 and the capacitive input electrode 1120 may be adjusted by adjusting a distance between the capacitive input terminal 1122 and the capacitive output electrode 1100.

According to an embodiment, since the capacitive input electrode 1120 includes a plurality of capacitive input terminals 1122, a breakdown voltage may be stably maintained. Furthermore, since each of the capacitive input terminals 1122 has a round shape protruding toward the capacitive output electrode 1100, a static electricity may be prevented from being focused on a specific point.

Figure 10B:
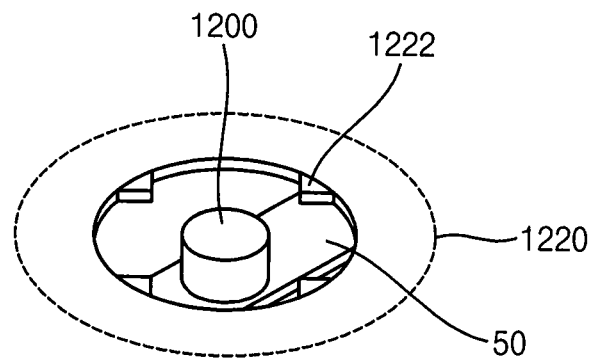

Referring to FIG. 10B, a capacitive output electrode does not include a capacitive output terminal, and a capacitive input terminal of a capacitive input electrode has a sharp end.

Referring to FIGS. 3 and 10B, a spark-preventing element for a printed circuit board includes a capacitive output electrode 1200, a capacitive input electrode 1220, an interlayer conductive member 130, an interlayer insulation member 140 and an air gap 150.

The capacitive output electrode 1200 is disposed at the same layer as an upper ground layer 30, and is disposed on an upper surface of the interlayer conductive member 130. In an exemplary embodiment, the capacitive output electrode 1200 has a circular shape in a plan view, and includes the same material as the upper ground layer 30. In an exemplary embodiment, the capacitive output electrode 1200 does not include a capacitive output terminal like the capacitive output terminal 112 illustrated in FIG. 2.

The capacitive input electrode 1220 is disposed at the same layer as the upper ground layer 30, and is disposed on the upper surface of the interlayer insulation member 140. The capacitive input electrode 1220 is electrically connected to the upper ground layer 30.

The capacitive input electrode 1220 is spaced apart from the capacitive output electrode 1200 to surround the capacitive output electrode 1200.

The capacitive input electrode 1220 includes a plurality of capacitive input terminals 1222 that inwardly protrude from the capacitive input electrode 1220. In an exemplary embodiment, four capacitive input terminals 1222 are disposed evenly spaced apart from each other with a 90 degree interval to enclose the capacitive output electrode 1200 and to face the capacitive output electrode 1200.

In an exemplary embodiment, a side of each of the capacitive input terminals 1222, which faces the capacitive output electrode 1200, has a triangular shape with a tip protruding toward the capacitive output electrode 1200.

A distance between the capacitive input terminal 1222 and the capacitive output electrode 1200 is smaller than a distance between the capacitive output electrode 1200 and the capacitive input electrode 1220. Thus, a breakdown voltage between the capacitive output electrode 1200 and the capacitive input electrode 1220 may be adjusted by adjusting a distance between the capacitive input terminal 1222 and the capacitive output electrode 1200.

According to an embodiment, since each of the capacitive input terminals 1222 has a triangular shape having a sharp corner protruding from the capacitive output electrode 1200, a breakdown may be easily induced.

Figure 10C:
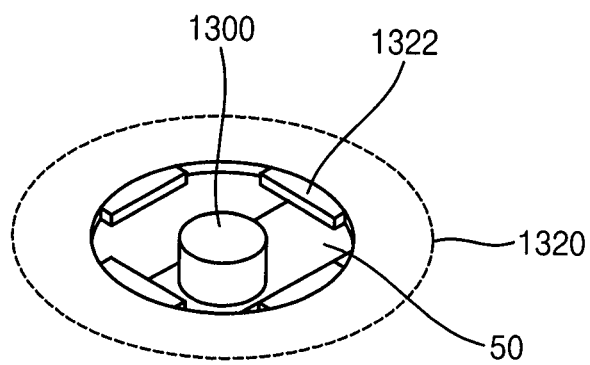

Referring to FIG. 10C, a capacitive output electrode does not include a capacitive output terminal, and a capacitive input terminal of a capacitive input electrode has a flat shape.

Referring to FIGS. 3 and 10C, a spark-preventing element for a printed circuit board includes a capacitive output electrode 1300, a capacitive input electrode 1320, an interlayer conductive member 130, an interlayer insulation member 140 and an air gap 150.

The capacitive output electrode 1300 is disposed at the same layer as an upper ground layer 30, and is disposed on an upper surface of the interlayer conductive member 130. In an exemplary embodiment, the capacitive output electrode 1300 has a circular shape in a plan view, and includes the same material as the upper ground layer 30. In an exemplary embodiment, the capacitive output electrode 1300 does not include a capacitive output terminal like the capacitive output terminal 112 illustrated in FIG. 2.

The capacitive input electrode 1320 is disposed at the same layer as the upper ground layer 30, and is disposed on the upper surface of the interlayer insulation member 140. The capacitive input electrode 1320 is electrically connected to the upper ground layer 30.

The capacitive input electrode 1320 is spaced apart from the capacitive output electrode 1300 to surround the capacitive output electrode 1300.

The capacitive input electrode 1320 includes a plurality of capacitive input terminals 1322 that inwardly protrude from the capacitive input electrode 1320. In an exemplary embodiment, four capacitive input terminals 1322 are disposed evenly spaced apart from each other with a 90 degree interval to enclose the capacitive output electrode 1300 and to face the capacitive output electrode 1300.

In an exemplary embodiment, each of the capacitive input terminals 1322 has a flat surface facing the capacitive output electrode 1300.

A distance between the capacitive input terminal 1322 and the capacitive output electrode 1300 is smaller than a distance between the capacitive output electrode 1300 and the capacitive input electrode 1320. Thus, a breakdown voltage between the capacitive output electrode 1300 and the capacitive input electrode 1320 may be adjusted by adjusting a distance between the capacitive input terminal 1322 and the capacitive output electrode 1300.

According to an embodiment, since each of the capacitive input terminals 1322 has a flat surface facing the capacitive output electrode 1300, a current may be prevented from rapidly flowing.

Figure 10D:
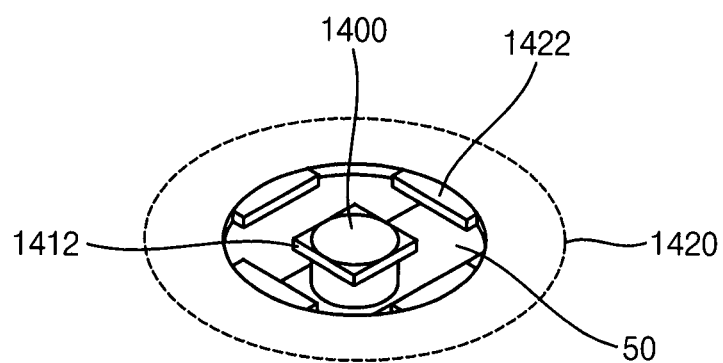

Referring to FIG. 10D, a capacitive output terminal of a capacitive output electrode has a flat shape, and a capacitive input terminal of a capacitive input electrode has a flat shape.

Referring to FIGS. 3 and 10D, a spark-preventing element for a printed circuit board includes a capacitive output electrode 1400, a capacitive input electrode 1420, an interlayer conductive member 130, an interlayer insulation member 140 and an air gap 150.

The capacitive output electrode 1400 is disposed at the same layer as an upper ground layer 30, and is disposed on an upper surface of the interlayer conductive member 130. In an exemplary embodiment, the capacitive output electrode 1400 has a circular shape in a plan view, and includes the same material as the upper ground layer 30.

The capacitive output electrode 1400 includes a plurality of capacitive output terminals 1412 that outwardly protrude from the capacitive output electrode 1400. In an exemplary embodiment, four capacitive output terminals 1412 are evenly disposed with a 90 degree interval around the capacitive output electrode 1400.

In an exemplary embodiment, each of the capacitive output terminals 1412 has a flat rectangular surface facing the capacitive input electrode 1420.

The capacitive input electrode 1420 is disposed at the same layer as the upper ground layer 30, and is disposed on the upper surface of the interlayer insulation member 140. The capacitive input electrode 1420 is electrically connected to the upper ground layer 30.

The capacitive input electrode 1420 is spaced apart from the capacitive output electrode 1400 to surround the capacitive output electrode 1400.

The capacitive input electrode 1420 includes a plurality of capacitive input terminals 1422 that inwardly protrude from the capacitive input electrode 1420. In an exemplary embodiment, four capacitive input terminals 1422 are disposed evenly spaced apart from each other with a 90 degree interval to enclose the capacitive output electrode 1400 and to face the capacitive output terminals 1412.

In an exemplary embodiment, each of the capacitive input terminals 1422 has a flat surface facing the capacitive output electrode 1400.

A distance between the capacitive input terminal 1422 and the capacitive output terminal 1412 is smaller than a distance between the capacitive output electrode 1400 and the capacitive input electrode 1420. Thus, a breakdown voltage between the capacitive output electrode 1400 and the capacitive input electrode 1420 may be adjusted by adjusting a distance between the capacitive input terminal 1422 and the capacitive output terminal 1412.

According to an embodiment, since each of the capacitive input terminals 1422 and the capacitive output terminals 1412 has a flat surface, a static electricity may be prevented from being focused on a specific point.

Figure 10E:
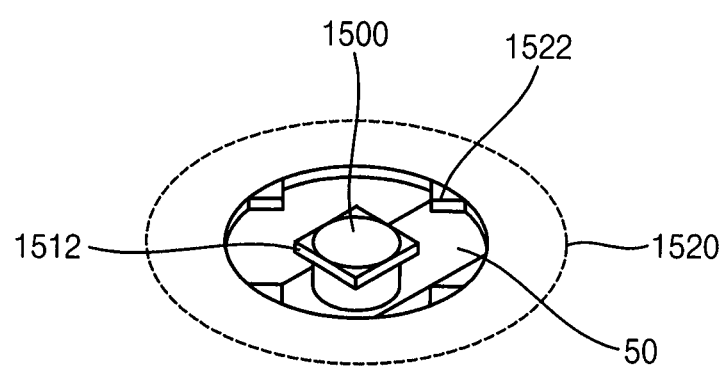

Referring to FIG. 10E, a capacitive output electrode of a capacitive output electrode has a flat shape, and a capacitive input terminal of a capacitive input electrode has a shape with a sharp end.

Referring to FIGS. 3 and 10E, a spark-preventing element for a printed circuit board includes a capacitive output electrode 1500, a capacitive input electrode 1520, an interlayer conductive member 130, an interlayer insulation member 140 and an air gap 150.

The capacitive output electrode 1500 is disposed at the same layer as an upper ground layer 30, and is disposed on an upper surface of the interlayer conductive member 130. In an exemplary embodiment, the capacitive output electrode 1500 has a circular shape in a plan view, and includes the same material as the upper ground layer 30.

The capacitive output electrode 1500 includes a plurality of capacitive output terminals 1512 that outwardly protrude from the capacitive output electrode 1500. In an exemplary embodiment, four capacitive output terminals 1512 are evenly disposed with a 90 degree interval around the capacitive output electrode 1500.

In an exemplary embodiment, each of the capacitive output terminals 1512 has a flat rectangular surface facing the capacitive input electrode 1520.

The capacitive input electrode 1520 is disposed at the same layer as the upper ground layer 30, and is disposed on the upper surface of the interlayer insulation member 140. The capacitive input electrode 1520 is electrically connected to the upper ground layer 30.

The capacitive input electrode 1520 is spaced apart from the capacitive output electrode 1500 to surround the capacitive output electrode 1500.

The capacitive input electrode 1520 includes a plurality of capacitive input terminals 1522 that inwardly protrude from the capacitive input electrode 1520. In an exemplary embodiment, four capacitive input terminals 1522 are disposed evenly spaced apart from each other with a 90 degree interval to enclose the capacitive output electrode 1500 and to face the capacitive output terminals 1512.

In an exemplary embodiment, each of the capacitive input terminals 1522 has a triangular shape with a tip protruding toward the capacitive output electrode 1500.

A distance between the capacitive input terminal 1522 and the capacitive output terminal 1512 is smaller than a distance between the capacitive output electrode 1500 and the capacitive input electrode 1520. Thus, a breakdown voltage between the capacitive output electrode 1500 and the capacitive input electrode 1520 may be adjusted by adjusting a distance between the capacitive input terminal 1522 and the capacitive output terminal 1512.

According to an embodiment, since each of the capacitive input terminals 1522 has a sharp shape, and since each of the capacitive output terminals 1512 has a flat surface facing the capacitive input terminals 1522, a breakdown voltage may be reduced.

Figure 11:
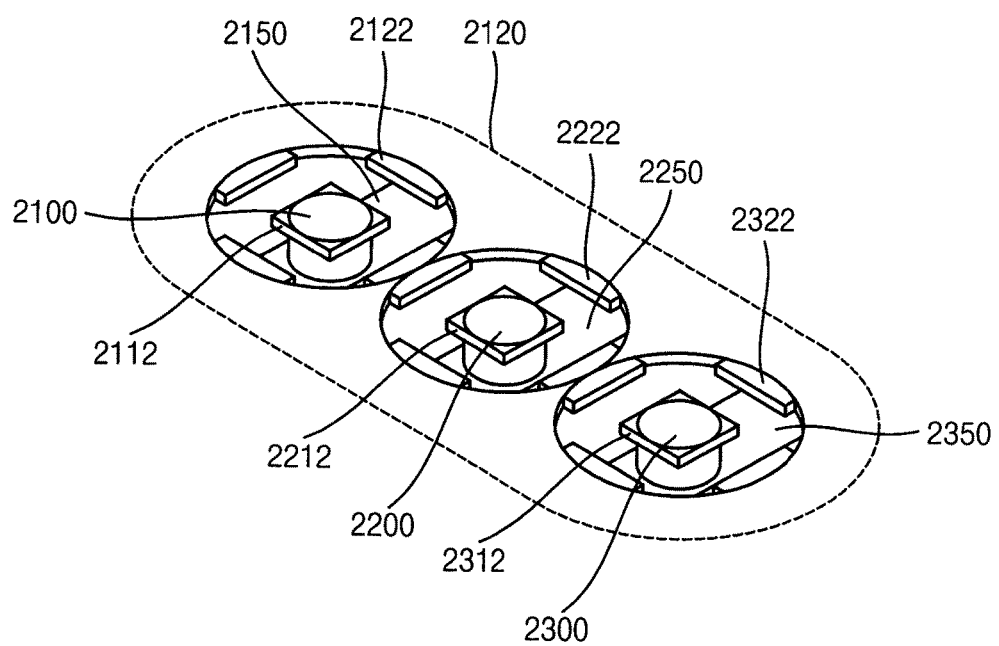
FIG. 11 is a perspective view illustrating a spark-preventing element for a printed circuit board according to an exemplary embodiment.

FIG. 11 is a perspective view illustrating a spark-preventing element for a printed circuit board according to an exemplary embodiment. In an exemplary embodiment, components of the spark-preventing element may be substantially same as the previously explained spark-preventing element except for the number of the components. Thus, any duplicative explanation may be omitted.

Referring to FIGS. 3 and 11, a spark-preventing element for a printed circuit board includes a first capacitive output electrode 2100, a second capacitive output electrode 2200, a third capacitive output electrode 2300, a capacitive input electrode 2120 that encloses all the first, second and third capacitive output electrodes 2100, 2200 and 2300, a an interlayer conductive member 130, an interlayer insulation member 140 and an air gap 150.

The first capacitive output electrode 2100, the second capacitive output electrode 2200 and the third capacitive output electrode 2300 are disposed at the same layer as an upper ground layer 30, and are disposed on an upper surface of the interlayer conductive member 130. In an exemplary embodiment, each of the first to third capacitive output electrodes 2100, 2200 and 2300 has a circular shape in a plan view, and includes the same material as the upper ground layer 30.

The first capacitive output electrode 2100, the second capacitive output electrode 2200 and the third capacitive output electrode 2300 are electrically connected to a first signal line 2150, a second signal line 2250 and a third signal line 2350, respectively, through interlayer conductive portions.

In an exemplary embodiment, the first signal line 2150, the second signal line 2250 and the third signal line 2350 are disposed at the same layer to effectively prevent a spark in the printed circuit board.

The first to third capacitive output electrodes 2100, 2200 and 2300 respectively include a plurality of capacitive output terminals 2112, 2212 and 2312 that outwardly protrude therefrom. In an exemplary embodiment, four capacitive output terminals 2112 are evenly disposed with a 90 degree interval around the capacitive output electrode 2100, four capacitive output terminals 2212 around the capacitive output electrode 2200, and four capacitive output terminals 2312 around the capacitive output electrode 2300.

In an exemplary embodiment, each of the capacitive output terminals 2112, 2212 and 2312 has a flat rectangular surface.

The capacitive input electrode 2120 is disposed at the same layer as the upper ground layer 30, and is disposed on the upper surface of the interlayer insulation member 140. The capacitive input electrode 2120 is electrically connected to the upper ground layer 30.

The capacitive input electrode 2120 is spaced apart from first to third capacitive output electrodes 2100, 2200 and 2300 to surround the first to third capacitive output electrodes 2100, 2200 and 2300

The capacitive input electrode 2120 includes a plurality of capacitive input terminals 2122, 2222 and 2322 that protrude toward the capacitive output electrodes 2100, 2200 and 2300, respectively, from the capacitive output electrode 2120. In an exemplary embodiment, four capacitive input terminals 2122 are disposed evenly spaced apart from each other with a 90 degree interval to enclose and face the capacitive output electrode 2100, four capacitive input terminals 2222 to enclose and face the capacitive output electrode 2200, and four capacitive input terminals 2322 to enclose and face the capacitive output electrode 2300.

In an exemplary embodiment, each of the capacitive input terminals 2122, 2222 and 2322 has a flat rectangular shape facing each of the capacitive output terminals 2112, 2212 and 2312.

A distance between the capacitive input terminals 2122, 2222 and 2322 and the respective capacitive output terminals 2112, 2212 and 2312 is smaller than a distance between the first to third capacitive output electrodes 2100, 2200 and 2300 and the capacitive input electrode 2120. Thus, a breakdown voltage between the first to third capacitive output electrodes 2100, 2200 and 2300 and the capacitive input electrode 2120 may be adjusted by adjusting a distance between the capacitive input terminals 2122, 2222 and 2322 and the respective capacitive output terminals 2112, 2212 and 2312.

According to an embodiment, as a spark-preventing element for a printed circuit board is connected to the signal lines 2150, 2250 and 2350, a spark may be effectively prevented.

Figure 12:
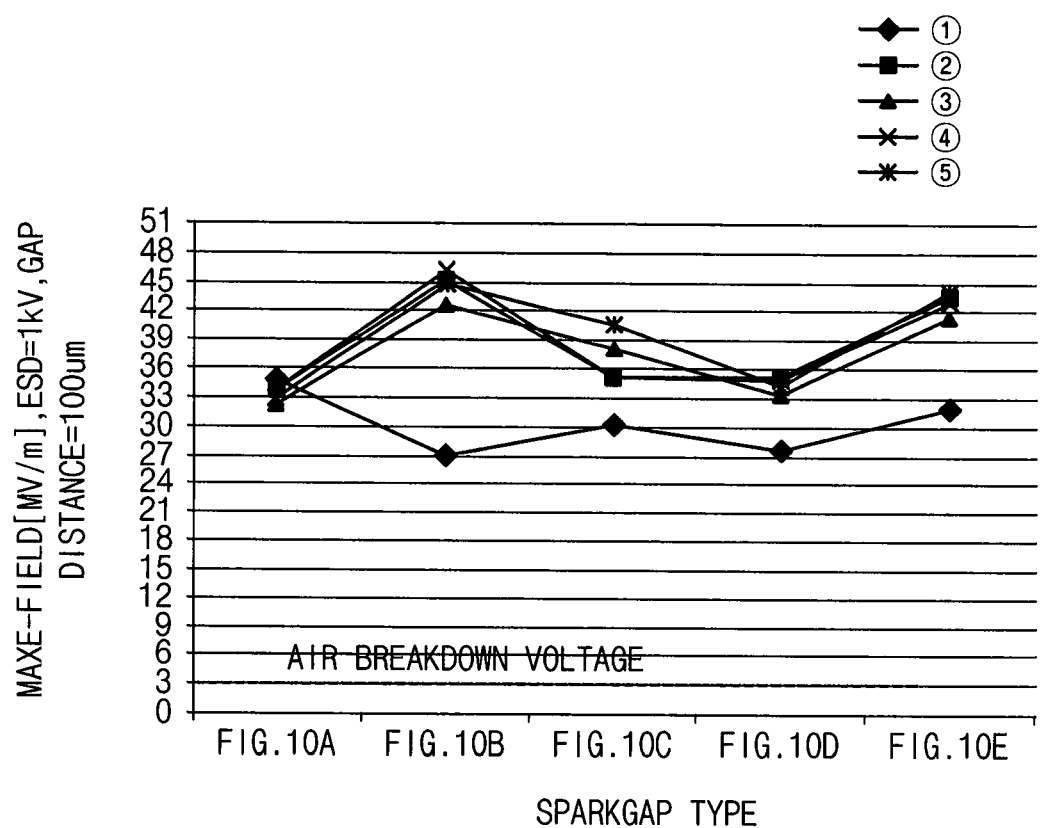
FIG. 12 a graph showing breakdown voltages of the spark-preventing elements for a printed circuit board.

FIG. 12 a graph showing breakdown voltages of the spark-preventing elements for a printed circuit board. Referring to FIG. 12, ① represents a printed circuit board including a signal line and a spark-preventing element, which are disposed on the same plane. ② represents a printed circuit board having a vertical structure of the printed circuit board illustrated in FIG. 1. ③ represents a printed circuit board that is same as the printed circuit board illustrated in FIG. 6. ④ represents a printed circuit board having a vertical structure of the printed circuit board illustrated in FIG. 1 and an array structure of the printed circuit board illustrated in FIG. 11. ⑤ represents a printed circuit board having a vertical structure of the printed circuit board illustrated in FIG. 6 and an array structure of the printed circuit board illustrated in FIG. 11. Each of the printed circuit boards were evaluated with changing shapes of capacitive output electrodes and capacitive input electrodes as illustrate in FIGS. 10A to 10E, which represents the horizontal axis (x-axis) of the graph shown in FIG. 12.

Referring to FIG. 12, it can be noted that the printed circuit boards having the structure illustrated in FIGS. 1 and 6 has breakdown voltages entirely increased with compared to the printed circuit board including a signal line and a spark-preventing element, which are disposed on the same plane.

When a capacitive output electrode and a capacitive input electrode have a round shape to face each other as illustrated in FIG. 10A, the breakdown voltages were about 33 MV/m with about a gap of 100 μm and a static electricity of about 1 kV.

When a capacitive input electrode includes a capacitive input terminal having a sharp corner as illustrated in FIG. 10B, the breakdown voltage of the printed circuit board of ① was about 27 MV/m with about a gap of 100 μm and a static electricity of about 1 kV. However, the breakdown voltages of the printed circuit board of ②, ③, ④ and ⑤ were about 42 MV/m to 46 MV/m.

When a capacitive input electrode includes a capacitive input terminal having a flat end as illustrated in FIG. 10C, the breakdown voltage of the printed circuit board of ① was about 30 MV/m with about a gap of 100 μm and a static electricity of about 1 kV. However, the breakdown voltages of the printed circuit board of ②, ③, ④ and ⑤ were about 35 MV/m to 41 MV/m.

When a capacitive output electrode includes a capacitive output terminal having a flat end, and a capacitive input electrode includes a capacitive input terminal having a flat end as illustrated in FIG. 10D, the breakdown voltage of the printed circuit board of ① was about 28 MV/m with about a gap of 100 μm and a static electricity of about 1 kV. However, the breakdown voltages of the printed circuit board of ②, ③, ④ and ⑤ were about 33 MV/m to 35 MV/m.

When a capacitive input electrode includes a capacitive input terminal having a flat end as illustrated in FIG. 10E, the breakdown voltage of the printed circuit board of ① was about 32 MV/m with about a gap of 100 μm and a static electricity of about 1 kV. However, the breakdown voltages of the printed circuit board of ②, ③, ④ and ⑤ were about 41 MV/m to 44 MV/m.

According to the above results, it can be noted that the breakdown voltage of the printed circuit boards was highest when a capacitive input electrode includes a capacitive input terminal having a sharp corner as illustrated in FIG. 10B. Furthermore, it can be noted that the breakdown voltage of the printed circuit boards was most stable when a capacitive output electrode includes a capacitive output terminal having a flat end, and a capacitive input electrode includes a capacitive input terminal having a flat end as illustrated in FIG. 10D.

According to the exemplary embodiment, the solder resistor is patterned to be removed between the capacitive output electrode and the capacitive input electrode. Thus, even if the number of operations of the spark-preventing element is increased, a breakdown voltage may be stably maintained.

Furthermore, since the capacitive input electrode surrounds the capacitive output electrode, leakage of a static electricity may be prevented.

Furthermore, since the signal line is electrically insulated from the capacitive input terminal and the capacitive input electrode, a parasitic capacitor between the signal line and the capacitive input electrode or between the signal line and the capacitive input terminal may be prevented.

Furthermore, the capacitive input electrode is electrically connected to the lower ground layer as well as the upper ground layer, a static electricity applied to the signal line may be effectively grounded.

Furthermore, since the spark-preventing element is disposed in a layer different from the signal line, a circuit may be designed with various configurations.

Furthermore, when the insulation substrate includes a plurality of insulation layers, a spark may be prevented even if a circuit structure is complicated.

Furthermore, when the capacitive input electrode includes a plurality of capacitive input terminals, a breakdown voltage may be uniformly maintained. Furthermore, when the capacitive input terminals have a round shape protruding toward the capacitive output electrode, a static electricity may be prevented from being focused on a specific point.

Furthermore, when the capacitive input terminals have a flat surface facing the capacitive output electrode, a current may be prevented from rapidly flowing.

Furthermore, when the capacitive input terminals and the capacitive output terminals have a flat surface to face each other with a uniform gap, a static electricity may be prevented from being focused on a specific point.

Furthermore, when the spark-preventing element is connected to a plurality of signal lines, a spark may be effectively prevented.

Accordingly, an electrical characteristic, reliability and durability of the spark-preventing element may be improved, and a breakdown voltage may be easily adjusted.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A spark-preventing element embedded in a printed circuit board comprising an insulation substrate, a solder resistor disposed on the insulation substrate, a ground layer disposed on the insulation substrate, and a signal line, the spark-preventing element comprising:
a capacitive output electrode disposed at the same layer as the ground layer;
a capacitive input electrode spaced apart from the capacitive output electrode with an air gap disposed between the capacitive output electrode and the capacitive input electrode, the capacitive input electrode surrounding the capacitive output electrode, the capacitive input electrode being electrically connected to the ground layer of the printed circuit board;
an interlayer conductive member embedded in the insulation substrate of the printed circuit board, the interlayer conductive member electrically connecting the capacitive output electrode to the signal line; and
an interlayer insulation member electrically insulating the capacitive input electrode from the signal line,
wherein the ground layer comprises an upper ground layer disposed on an upper surface of the insulation substrate, a lower ground layer disposed on a lower surface of the insulation substrate, and a ground connector electrically connecting the upper ground layer to the lower ground layer,
wherein the capacitive input electrode is directly connected to the upper ground layer so that the air gap between the capacitive output electrode and the capacitive input electrode is disposed at the same layer as the upper ground layer, and the lower ground layer is disposed at the same layer as the signal line, and
wherein the ground connector is wholly embedded with the insulation substrate.

2. The spark-preventing element of claim 1, further comprising a capacitive input terminal connected to the capacitive input electrode and protruding toward the capacitive output electrode.

3. The spark-preventing element of claim 2, wherein the capacitive input terminal includes a round surface.

4. The spark-preventing element of claim 2, wherein the capacitive input terminal includes a sharp corner.

5. The spark-preventing element of claim 2, wherein the capacitive input terminal includes a flat rectangular surface.

6. The spark-preventing element of claim 2, further comprising a capacitive output terminal connected to the capacitive output electrode and protruding toward the capacitive input terminal.

7. The spark-preventing element of claim 6, wherein the capacitive output terminal includes a flat rectangular surface facing the capacitive input terminal.

8. The spark-preventing element of claim 2, further comprising a plurality of capacitive output terminals connected to the capacitive output electrode and protruding toward the capacitive input terminal.

9. The spark-preventing element of claim 1, further comprising a plurality of the capacitive input terminals connected to the capacitive input electrode and protruding toward the capacitive output electrode.

10. The spark-preventing element of claim 1, comprising a plurality of capacitive output electrodes, the printed circuit board including a plurality of signal lines, each of the capacitive output electrode being electrically connected to one of the signal lines.

11. The spark-preventing element of claim 10, wherein the capacitive input electrode is spaced apart from each of the capacitive output electrodes with an air gap disposed between the capacitive input electrode and the each of the capacitive output electrode, the capacitive input electrode enclosing each of the capacitive output electrodes.

12. The spark-preventing element of claim 1, wherein the capacitive output electrode has a same width as the interlayer conductive member.

13. A spark-prevented substrate, comprising:
a printed circuit board comprising:
an insulation substrate;
a solder resistor disposed on the insulation substrate;
a ground layer disposed on the insulation substrate; and
a signal line; and
a spark-preventing element embedded in the printed circuit board, the spark-preventing element comprising:
a capacitive output electrode disposed at the same layer as the ground layer;
a capacitive input electrode spaced apart from the capacitive output electrode with an air gap disposed between the capacitive output electrode and the capacitive input electrode, the capacitive input electrode surrounding the capacitive output electrode, the capacitive input electrode being electrically connected to the ground layer of the printed circuit board;
an interlayer conductive member embedded in the insulation substrate of the printed circuit board, the interlayer conductive member electrically connecting the capacitive output electrode to the signal line; and
an interlayer insulation member electrically insulating the capacitive input electrode from the signal line,
wherein the ground layer comprises an upper ground layer disposed on an upper surface of the insulation substrate, a lower ground layer disposed on a lower surface of the insulation substrate, and a ground connector electrically connecting the upper ground layer to the lower ground layer,
wherein the capacitive input electrode is directly connected to the upper ground layer so that the air gap between the capacitive output electrode and the capacitive input electrode is disposed at the same layer as the upper ground layer, and the lower ground layer is disposed at the same layer as the signal line, and
wherein the ground connector is wholly embedded with the insulation substrate.

14. The spark-preventing substrate of claim 13, wherein the air gap is not covered by any element of the printed circuit board.

15. The spark-preventing substrate of claim 13, wherein the capacitive output electrode is disposed at the same layer as the upper ground layer.

16. The spark-preventing substrate of claim 13, wherein the capacitive input electrode is disposed at the same layer as the capacitive output electrode.

17. The spark-preventing substrate of claim 13, wherein the insulation substrate includes an upper insulation layer and a lower insulation layer disposed under the upper insulation layer.

18. The spark-preventing substrate of claim 17, wherein the signal line is disposed between the upper insulation layer and the lower insulation layer.

19. The spark-preventing substrate of claim 17, wherein the lower ground layer is disposed between the upper insulation layer and the lower insulation layer, and the ground connector passes through the upper insulation layer.

20. The spark-preventing substrate of claim 13, wherein the capacitive output electrode is disposed in a layer different from the signal line.

\* \* \* \* \*